United States Patent [19]
Ohi

[11] Patent Number: 4,837,444
[45] Date of Patent: Jun. 6, 1989

[54] ELECTRON MICROSCOPE

[75] Inventor: Kimio Ohi, Tokyo, Japan

[73] Assignee: Jeol Ltd., Tokyo, Japan

[21] Appl. No.: 194,983

[22] Filed: May 17, 1988

[30] Foreign Application Priority Data

May 22, 1987 [JP] Japan ................. 62-125540

[51] Int. Cl.⁴ ............................................. G21K 5/10
[52] U.S. Cl. ............................. 250/442.1; 250/440.1
[58] Field of Search ............... 250/440.1, 441.1, 442.1, 250/311, 310

[56] References Cited

U.S. PATENT DOCUMENTS 3,612,863 10/1971 Suzuki ................. 250/442.1
3,896,314 7/1975 Nukui et al. .......... 250/442.1
4,596,934 6/1986 Yanaka et al. ......... 250/442.1

FOREIGN PATENT DOCUMENTS 0097537 5/1985 Japan ................. 250/442.1

OTHER PUBLICATIONS

"A Container for Handling Small Specimens During Preparation and Examination in the Scanning Electron Microscope (SEM)", Taylor, *Jour. of Micro.*, vol. 105, pp. 335-338, 1975, 250-440.1.

*Primary Examiner*—Bruce C. Anderson
*Attorney, Agent, or Firm*—Webb, Burden, Ziesenheim & Webb

[57] ABSTRACT

There is disclosed an electron microscope equipped with two specimen-positioning devices one of which includes a small specimen holder adapted for high-resolution observation. The other includes a large specimen holder adapted for special observation. The holders are interchangeably placed on the optical axis of the electron beam between upper and lower magnetic pole pieces.

3 Claims, 2 Drawing Sheets

ELECTRON MICROSCOPE

FIELD OF THE INVENTION

The present invention relates to an electron microscope equipped with specimen-positioning devices of the so-called side entry type for inserting specimens from directions perpendicular to the optical axis of the electron beam.

BACKGROUND OF THE INVENTION

Specimen-positioning systems of the side entry type have found wide application in electron microscopy. In recent years, it has been frequently required that special observations be made using such a specimen-positioning device of the side entry type. One example of special observation is to observe a specimen placed in an atmosphere of a gas. Another example is to observe a moist specimen as it is. In these cases, a specimen chamber having an opening permitting passage of an electron beam is mounted to a holder. The inside of the chamber can be maintained at the atmospheric pressure. A specimen is placed inside the chamber, which is supplied with a given gas or water vapor. Since the specimen holder is required to mount the specimen chamber and a supply pipe, the holder is made large in size. A mechanism for translating and tilting the large specimen holder is also large. As a result, it is inevitable that the whole specimen-positioning device becomes bulky.

When a high-resolution observation is made using a specimen-positioning device of the side entry type, a small-sized system is needed. That is, all of the specimen holder, the translating mechanism, and the tilt mechanism must be small. As the system is reduced in size, the natural frequency of the positioning device increases. Therefore, neither vibration produced inside the electron microscope, for example, due to flow of refrigerant nor extraneous vibration is transmitted to the specimen. Consequently, high-resolution observation is allowed.

High-resolution observation is not achievable with the aforementioned large specimen-positioning device. Conversely, no special observation can be attained with the small specimen-positioning device. Therefore, it has been the common practice to replace the small specimen-positioning device by the large specimen-positioning device when a special observation is made after a high-resolution observation is made employing the small positioning device. Also in the reverse situation, the specimen-positioning device is required to be replaced. This replacement operation involves breaking the vacuum in the microscopic column and disassembling a part of the column. This necessarily prolongs the replacement operation.

SUMMARY OF THE INVENTION

It is an object of the invention to provide an electron microscope which can be quickly switched from high-resolution observation mode to special observation mode or vice versa without the need to disassemble the apparatus.

In one embodiment of the invention, an electron microscope is equipped with a small specimen holder for high-resolution observation and also with a large specimen holder for special observation. These two holders are moved separately by their respective drive mechanisms, and interchangeably inserted into the microscope from directions substantially perpendicular to each other.

Other objects and features of the invention will appear in the course of the description thereof which follows.

DESCRIPTION OF THE PREFERRED EMBODIMENT

Figure 1:
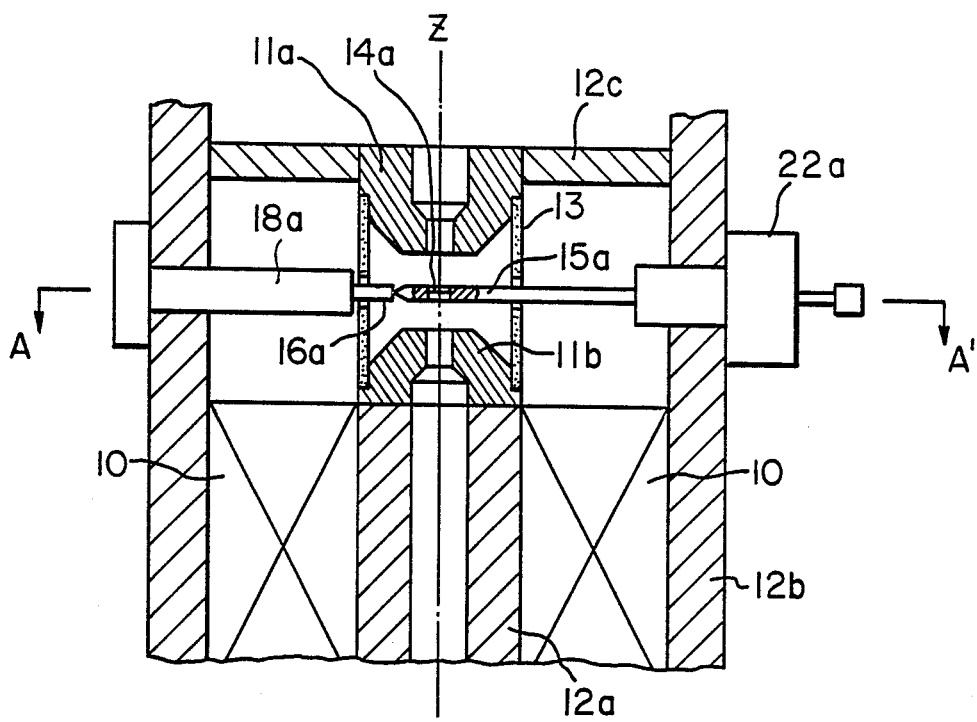
FIG. 1 is a fragmentary cross-sectional view of an electron microscope according to the invention.
Figure 2:
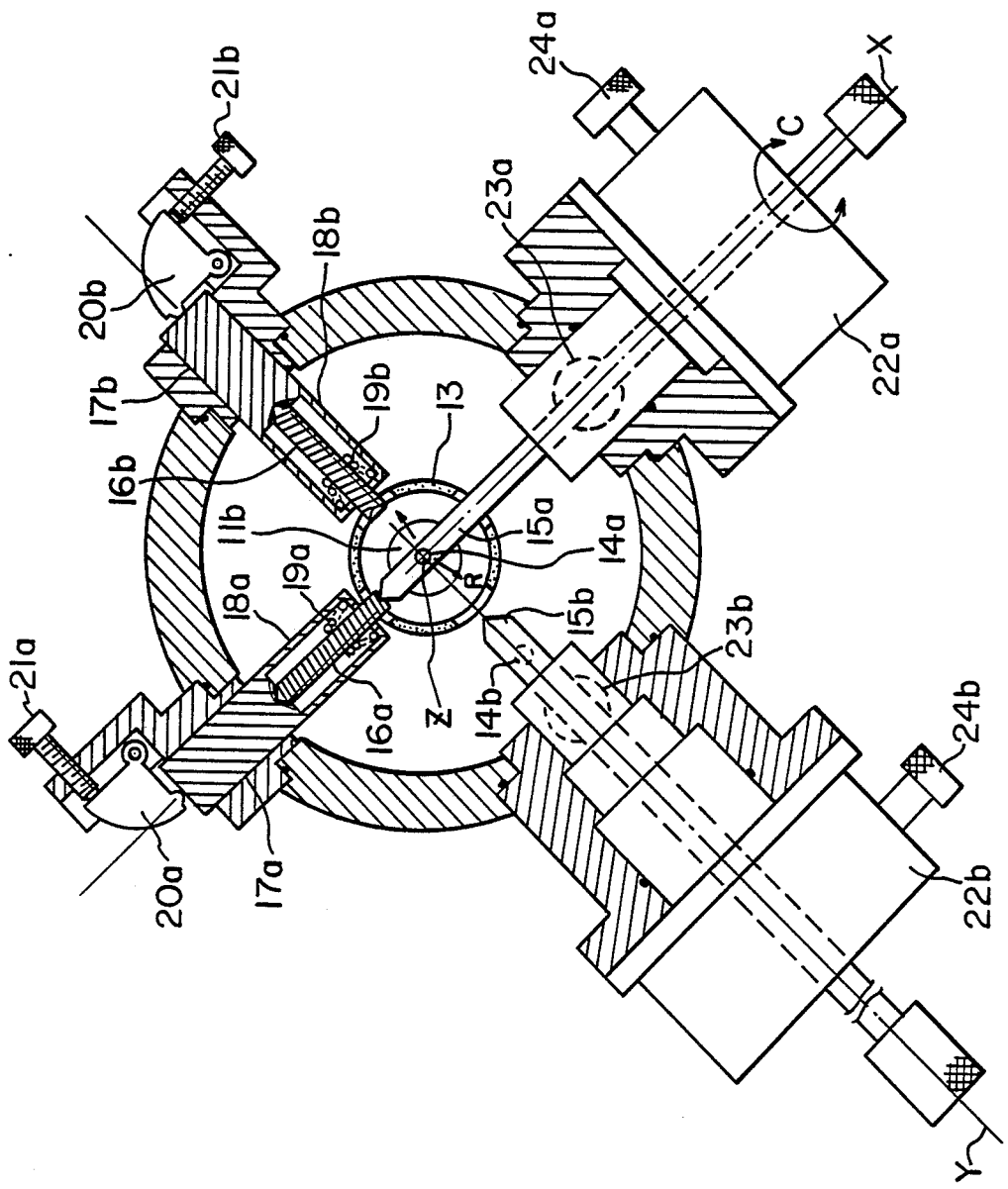
FIG. 2 is a cross-sectional view taken on line A—A' of FIG. 1.

Referring to FIGS. 1 and 2, an electron microscope has an objective lens comprising an exciting coil 10, an upper magnetic pole piece 11a, a lower magnetic pole piece 11b, an inner yoke 12a, an outer yoke 12b, and an upper yoke 12c. The pole pieces 11a and 11b are coupled together by a nonmagnetic spacer 13. A specimen 14a is held by a specimen holder 15a that is used in high-resolution observation mode. The holder 15a is inserted between the two pole pieces along the X-Y plane perpendicular to the optical axis Z of the electron beam.

During this insertion, the holder 15a is moved across the optical axis Z in the X-direction. The front end of the holder 15a bears against a pivot pin 16a that is supported by a pivot bearing 17a and springs 19a. The springs 19a are attached to a Cylinder 18a mounted to the bearing 17a, which is supported by a lever member 20a. This lever member 20a is held by a screw 21a. The holder 15a can be moved in the X-direction by rotating the screw 21a to push the lever member 20a.

The specimen holder 15a extends through both a rotary body 22a and a ball joint 23a. A screw 24 that serves to push the holder 15a is mounted to the rotary body 22a. The specimen 14a held at the front end of the holder 15a is rotated about the ball joint 23a in either of the two directions indicated by the arrow R by moving the screw 24a forward or backward. As a result, the specimen 14a can be moved substantially in the Y-direction. Also, the specimen 14a can be tilted relative to the optical axis Z by rotating the rotary body 22a in either of the two directions indicated by the arrow C.

The specimen holder 15a and the mechanism for moving it are rendered as small as possible to make the natural frequency of the positioning device far higher than the frequency of vibration which might arrive from the outside. Thus, transmission of vibration to the specimen can be sufficiently prevented. This enables high-resolution observation.

Another specimen holder 15b holding a specimen 14b is used in special observation mode. The holder 15b is inserted between the two magnetic pole pieces along the X-Y plane from the Y-direction. The mechanism that supports the front end of the specimen holder 15b and the mechanisms for translating and rotating the specimen holder 15b are similar in structure to their counterparts associated with the specimen holder 15a, but the letter "a" added to their reference numerals has been replaced by the letter "b". The specimen holder 15b is made large to have a specimen chamber for placing the specimen in a special environment as described above. The mechanisms for translating and rotating the holder 15b are also made large to permit it to be inserted between the magnetic pole pieces.

In the operation of the electron microscope constructed as described above, when the specimen 14a is observed with a high resolution, the specimen holder 15a is placed on the optical axis as shown in FIG. 2.

When the specimen 14b is then observed in a special environment, the specimen holder 15a is moved rearward out of the space between the magnetic pole pieces. Then, the holder 15b is advanced to place it on the optical axis. This series of operations can be completed in a quite short time, because it is not necessary to break the vacuum in the microscopic column.

It is to be understood that the foregoing description relates to only a preferred embodiment of the invention, and that various changes and modifications may be made. The directions in which the specimen holders are moved onto the optical axis by the two specimen-positioning devices form an angle $\theta$ which can be set to any desired angle, as well as right angles.

The mechanism including the pivot pins 16a, 16b and the pivot bearings 17a, 17b for propping the front ends of the specimen holders 5a and 5b and moving them forward or rearward can be omitted. In this case, it is necessary to mount the mechanisms for moving the holders forward or rearward on the rotary bodies 22a and 22b. The two specimen-positioning devices can be disposed on opposite sides of the optical axis Z, i.e., $\theta = 180°$.

Having thus described my invention with the details and particularity required by the Patent Laws, what is desired to be protected by Letters Patent is set forth in the following claims.

What is claimed is:

1. An electron microscope having an, objective lens including upper and lower magnetic pole pieces and specimen-positioning devices each of which moves a specimen holder along a plane perpendicular to the optical axis of an electron beam and brings the specimen holder onto the optical axis between the pole pieces, said electron microscope comprising:
   a small specimen holder for, high-resolution observation;
   a large specimen holder for special observation;
   a first drive mechanism for moving the small specimen holder along said plane onto the optical axis; and
   a second drive mechanism for moving the large specimen holder along said plane from a direction different from the direction in which the small specimen holder is moved by the first drive mechanism, to bring the large specimen holder onto the optical axis.

2. The electron microscope of claim 1, wherein the two specimen holders are moved onto the optical axis from directions substantially perpendicular to each other.

3. The electron microscope of claim 1, wherein the two specimen holders are moved onto the optical axis from substantially diametrically opposite directions.

* * * * *